United States Patent
Baba et al.

[11] Patent Number: 6,090,361
[45] Date of Patent: Jul. 18, 2000

[54] METHOD FOR PRODUCING SILICON FOR USE IN SOLAR CELLS

[75] Inventors: Hiroyuki Baba; Masamichi Abe; Kazuhiro Hanazawa; Naomichi Nakamura; Noriyoshi Yuge, all of Chiba; Yasuhiko Sakaguchi, Tokyo; Yoshiei Kato; Tetsuya Fujii, both of Chiba, all of Japan

[73] Assignee: Kawasaki Steel Corporation, Japan

[21] Appl. No.: 09/046,172

[22] Filed: Mar. 23, 1998

[30] Foreign Application Priority Data

| Mar. 24, 1997 | [JP] | Japan | 9-069589 |
| Mar. 24, 1997 | [JP] | Japan | 9-074876 |
| Mar. 25, 1997 | [JP] | Japan | 9-071546 |
| Nov. 14, 1997 | [JP] | Japan | 9-313289 |
| Nov. 14, 1997 | [JP] | Japan | 9-313291 |

[51] Int. Cl.[7] .......................... C01B 33/02; C01B 33/037
[52] U.S. Cl. ............................ 423/350; 423/348
[58] Field of Search ...................... 423/348, 350, 423/349

[56] References Cited

U.S. PATENT DOCUMENTS

| 4,242,307 | 12/1980 | Fally | 423/350 |
| 4,247,528 | 1/1981 | Dosaj et al. | 423/350 |
| 4,304,763 | 12/1981 | Dietl | 423/348 |
| 4,379,777 | 4/1983 | Boulos | 423/350 |
| 4,643,833 | 2/1987 | Aulich et al. | 423/348 |

FOREIGN PATENT DOCUMENTS

| 0 007 063 | 1/1980 | European Pat. Off. . |
| 2 440 913 | 6/1980 | France . |
| 3220241 | 12/1983 | Germany | 423/348 |
| 3241366 | 5/1984 | Germany | 423/348 |
| 3403131 | 8/1985 | Germany | 423/348 |
| 36 11 950 | 10/1987 | Germany . |
| 3-020422 | 1/1991 | Japan | 423/348 |
| 4-342496 | 11/1992 | Japan | 423/348 |
| 5-270814 | 10/1993 | Japan | 423/348 |
| 6-227808 | 8/1994 | Japan | 423/348 |

*Primary Examiner*—Ngoc-Yen Nguyen
*Attorney, Agent, or Firm*—Austin R. Miller

[57] ABSTRACT

Method for producing highly purified silicon for use in solar cells by a single solidification purification, pouring silicon into a mold and gradually fractionally solidifying it while solidifying the liquid surface, followed by purifying the solidified silicon by zone melting or continuous casting using an electromagnetic mold, or by zone melting in combination with continuous casting, and optionally causing directional solidification to concentrate impurities, leaching and recycling.

18 Claims, 10 Drawing Sheets

FIG. 1

FIG. 2
CONVENTIONAL

FIG. 3
CONVENTIONAL

METHOD FOR PRODUCING SILICON FOR USE IN SOLAR CELLS

BACKGROUND OF THE INVENTION

1. Field of the Invention

The present invention relates to a method for producing silicon that is suitable for use in making solar cells. This technology enables effective production of highly purified silicon for use in solar cells.

2. Description of the Related Art

Elemental impurities such as P, B, C, Fe, Al, Ti and O in silicon for use in solar cells need to be controlled. Impurities of P, B, Fe, Al and Ti should be below about 0.1 ppm, and impurities of C and O should be about 5 to 10 ppm to ensure desired energy conversion efficiency. In addition, large amounts of purified silicon should be available inexpensively in order to make wide use of it in solar cells.

Figure 3:
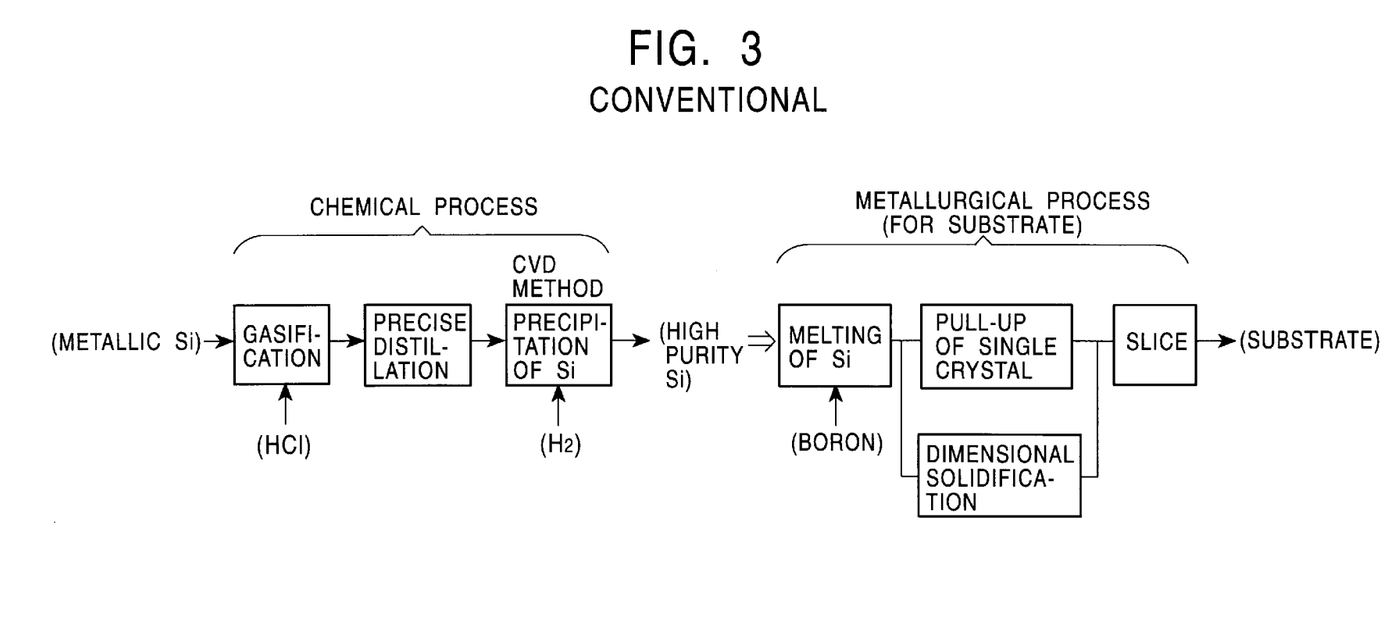
FIG. 3 is a flow diagram of a conventional method for purifying silicon.

Conventionally, silicon for use in solar cells has been mainly produced by about the same methods as silicon intended for use in semiconductors; i.e., by gas-phase methods as shown, for example, in FIG. 3 of the appended drawings. The method comprises reducing highly purified silicon oxide ($SiO_2$) with high purity carbon to produce a liquid of so-called crude metallurgical grade silicon, which has low purity; converting the metallurgical grade silicon into a silane compound; highly purifying the silane compound by distillation; and forming a substrate by solidification after purifying silicon by precipitation. This gas-phase method for mass-production not only has a high production cost, but its yield is low. It has such a high purity that elemental impurities such as B must even be added later.

In another conventional method for purifying silicon that is excellent for use in solar cells, using metallurgical grade silicon as a starting material, purification may be accomplished by use of a following metallurgical process.

Figure 4A:
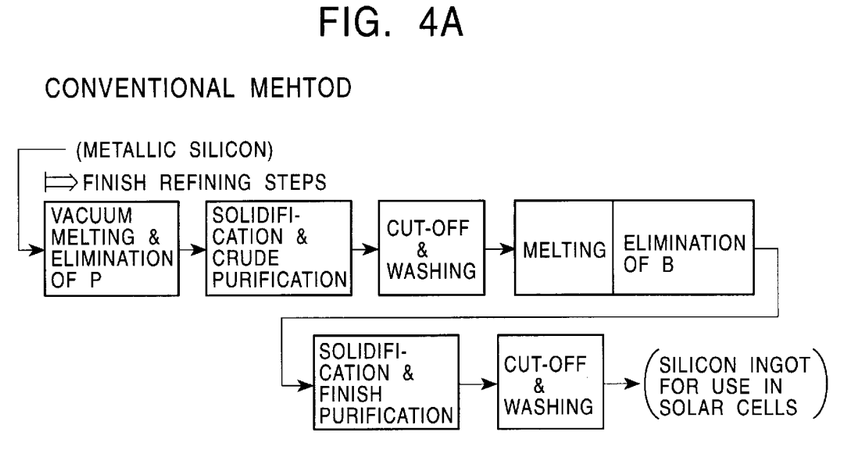
FIG. 4A is a conventional one.

As shown for example in FIG. 4A of the drawings, some of the metallic elemental impurities (such as Al, Ti, Fe and the like) are removed by directional solidification after first eliminating P by directional vacuum refining, then finish refining by again directionally melting the silicon again under refining conditions to remove B and C by oxidative refining, and applying by finish solidification purification which serves both to eliminate metallic impurities after de-oxidation and to produce an ingot. In other words, metallic impurities such as Al, Fe, Ti and the like in the metallurgical grade silicon are eliminated by two directional solidifications, taking advantage of the small solid-liquid partition coefficient of the impurities. C is precipitated on the surface during the solidification step or is eliminated as CO gas when C is present as a solid solution; P is eliminated in vacuum by taking advantage of its high vapor pressure; and B is eliminated by oxidative purification by adding $H_2O$, $CO_2$ or $O_2$. This metallurgical process enables mass-production with large scale facilities.

However, important problems remain. A different refining treatment is required for removing each impurity. Two complicated solidification purification steps are needed, and the process has low yield due to twice cutting off the top portion of the silicon ingot. There is also the high cost of electricity.

In each solidification step of FIG. 4A, metallic impurities tend to concentrate at one location in the molten metallurgical grade silicon as the solidification step nears its end. After each solidification the portion of the ingot that contains the concentrated portion of the impurities is cut off and discarded.

Since the cut-off portions account for about 20% of the solidified ingots, removal of these portions lowers the silicon yield. Productivity of the process shown in FIG. 4A would be greatly improved, and silicon for use in solar cells could be produced at a lower cost, if these silicon portion could be recycled.

OBJECTS OF THE INVENTION

Accordingly, an important object of the present invention is to provide a method for producing highly purified silicon for use in solar cells by single-step finishing solidification purification performing the finish refining steps.

Another object is to provide a method for re-use of substandard cut off silicon, wherein relatively impure products can be recycled and re-used as starting materials for producing silicon that is suitable for use in solar cells.

SUMMARY OF THE INVENTION

Figure 1:
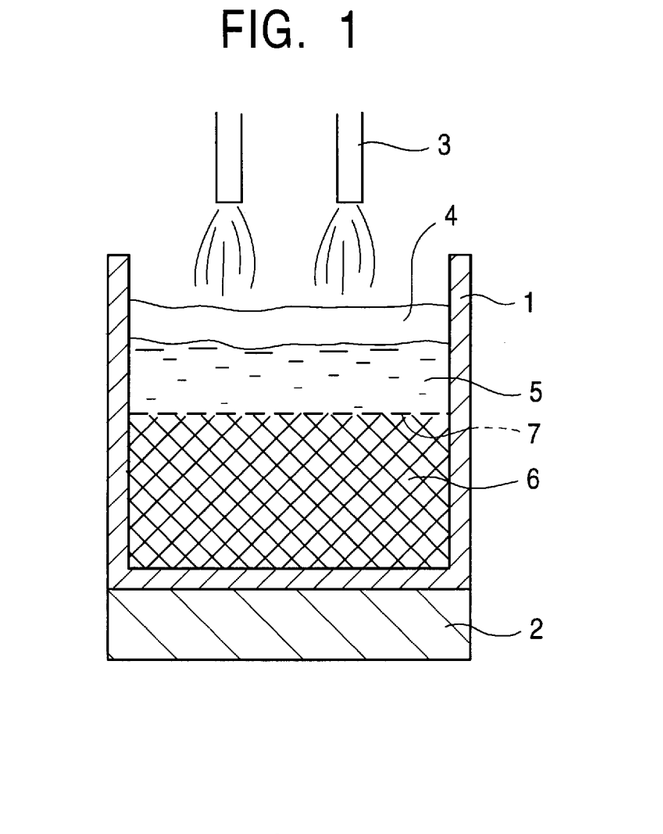
FIG. 1 is a vertical cross-sectional illustration of pre-treatment of metallurgical grade silicon according to the invention.
Figure 2:
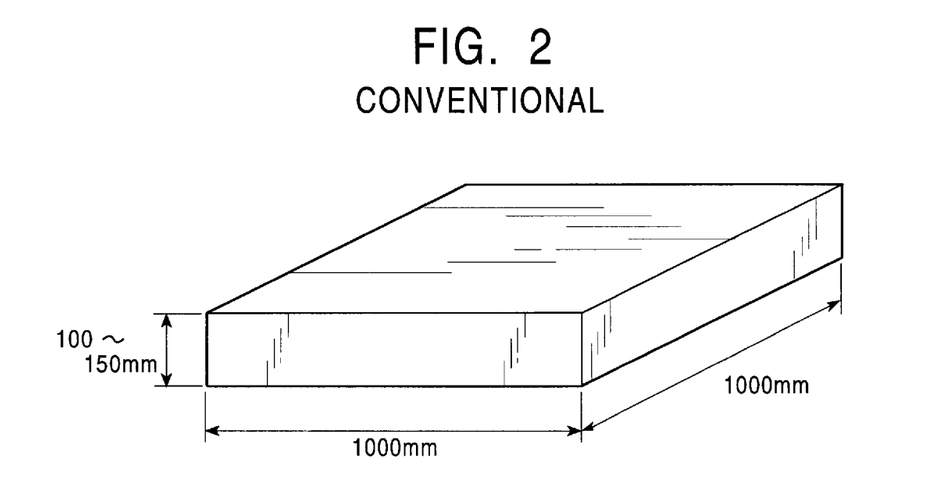
FIG. 2 is a perspective view showing a palette type mold used for solidifying the liquid. (conventional)

In accordance with the present invention, we have found that molten metallurgical grade silicon, after reduction $SiO_2$ with carbon, may be directly poured into a mold in the form of fused metallic silicon, such mold having a special dimensional factor. This factor, in terms of the ratio of height/(mean cross section of the mold/$\pi$)$^{1/2}$, is about 0.4 or more. The mold is preferably preheated. Then the molten silicon can be slowly cooled from about 700° to 1100° C. toward eventual solidification, while heating or heat-insulating the silicon liquid surface (FIG. 1). The solidification rate is preferably adjusted to about 10 mm/min or less. The method is characterized in that the solidified silicon is purified by omitting the foregoing solidification pre-purification refining step prior to finish refining steps.

The thickness of liquid silicon in the mold is measured during solidification, as with an ultrasonic range finder, for example. The liquid silicon may be discharged along with the contained impurities when the measured value reaches a desired level.

It is possible to change the conventional two-step solidification purification process to a single-step process at the finish refining steps by pre-treating the metallurgical grade silicon starting material to decrease the content of metallic elemental impurities such as Fe and Al to less than about 1000 ppm. The liquid silicon in which the impurities are concentrated may be discharged as in FIG. 5C before the liquid completely solidifies in the one-step solidification process. Further, the pre-heating purification step is simplified and the purification time is shortened, thereby improving the yield of silicon in the entire process. Consequently, highly purified silicon of suitable quality for use in solar cells can be produced better and much more inexpensively than before.

In accordance with another feature of the present invention, the metallurgical grade silicon may be refined by vacuum-melting the silicon to eliminate P, and eliminating B and C by introducing an acidic gas mixed with an inert gas, without solidifying the molten silicon, followed by eliminating O by de-oxidation at high temperature, solidifying in a mold to produce a solidified silicon rod, and zone-melting the rod to eliminate Fe, Al, Ti and Ca. Alternative steps will further be described hereinafter.

The resulting solidified silicon rod may be molded to eliminate B and C. This is done in an atmosphere of an inert gas or in a vacuum after melting the metallurgical grade silicon. It can be followed by eliminating P under reduced pressure, before solidifying the liquid.

It is advantageous for effectively molding the solidified silicon rod to withdraw the rod continuously out of the mold by continuous casting, using an electromagnetic mold, and by applying the zone-melting treatment along with the continuous casting withdrawal. The electromagnetic mold serves to stir the molten silicon in the mold, as well as to form a gap between the mold and the molten silicon, thereby achieving non-contact solidification.

The zone melting method is readily accomplished with use of high frequency heating coils disposed around the solidified silicon rod. The coils are readily controlled to effect successive, repeated, partial melting, cooling and solidification of the silicon. Improved purification can be achieved by repeating the process if the extent of impurity reduction is not satisfactory at first. Moreover, several repeated purification steps may be used, with the use of a plurality of separately controlled high frequency coils. These shorten the processing time compared to the time required when only a single step of zone melting is applied. Accordingly, a combination of a zone melting method with continuous casting makes it possible to achieve highly efficient purification with low production cost.

One-step purification was accordingly made possible in the solidification refining process described. However, the concentrated portion of the ingot, containing the impurities, was heretofore cut off and discarded. This discarded part often accounted for about 20% of the top portion of the ingot.

Through microscopic observation of the cut-off portion we have found that the metallic elemental impurities, as (Fe, Al)—Si compounds, had a tendency to concentrate at crystal grain boundaries having a width of about 20 µm. The crystal grain diameter of each crystal has been found to be about 0.5 to 2 mm. When the cut-off portion was crushed, it cracked along the crystal grain boundaries, thereby predominantly exposing the grain boundaries on the surface.

We have now discovered means for removing the impurities from the concentrated portions, as another feature of present invention. This is done by crushing the concentrated impurity portion of the ingot and leaching the impurity elements from the crushed pieces by applying an acid solution. The molten metallurgical grade silicon is directionally solidified, and elemental impurities are eliminated from the aforementioned concentrated portion as discussed. This is done by cutting off the impurity-concentrated portion of the ingot for recycling as a starting material.

Regarding recycling of the metallurgical grade silicon, in one embodiment, the portion of the ingot containing concentrated impurities is cut off and crushed into grains having a maximum diameter of about 5 mm. In another embodiment, impurities are leached from crushed grains under the action of a mixed acid solution containing hydrofluoric acid and/or nitric acid.

Since the elemental impurities may be extracted with an acid solution and by crushing, most of the elemental impurities can be eliminated by transferring the grains into the acid solution. Consequently, practical recycling of metallurgical grade silicon is achieved, thereby greatly improving the yield of silicon.

Conventional metallurgical grade silicon has been obtained by solidifying the liquid silicon poured into a shallow vessel with a wide cross-sectional area (so-called pallet) after reducing silicon oxide with carbon in an arc furnace. However, since the metallurgical grade silicon obtained by the method described above contains 1000 to 2000 ppm of metallic elemental impurities such as Fe and Al, the solidification purification step must be repeated twice when using the method shown in FIG. 4A, for example.

In the conventional solidification process, about 20% of the solidified portion where elemental impurities are concentrated must be cut off and removed. Accordingly, the requirement for twice applying the solidification purification process in conjunction with finish refining steps greatly affects the production cost. When post-treatment steps of the solidified silicon are required, the solid needs to be melted again, making it possible to improve the production process with respect to energy consumption.

In conventional processing, silicon intended for use in solar cells has been produced by oxidative refining of metallurgical grade silicon formed by reducing silicon oxide with carbon, solidification pre-purification, vacuum refining, and solidification finish purification.

BRIEF DESCRIPTION OF THE DRAWINGS

FIGS. 4A and 4B are flow diagrams illustrating methods for producing silicon for use in solar cells.

FIGS. 5A, 5B and 5C are schematic side elevation views which show different stages in a process according to the invention.

DESCRIPTION OF THE PREFERRED EMBODIMENTS

We have discovered a process for pre-treating metallurgical grade silicon by controlling the solidifying step of the liquid silicon from an arc electric furnace, Fe and Al contents can be decreased to a value below about 1000 ppm.

One example of pre-purification is shown in the simplified solidification purification process shown in FIG. 1. The liquid silicon 5 is directly poured into a deep mold 1, in which it can be solidified by a gradual cooling. The surface of the poured liquid is heated by a heating means 3 such as a burner, or is covered with a heat insulator 4, in order to cause the solidified surface 7 to move upwardly from the bottom of the mold 1. Consequently, upwardly heat leakage in the mold is less than heat leakage downwardly in the mold. This retards solidification and causes the collection of metallic impurity elements at the upper part of the solidified silicon 6. Directional solidification of this type does not always occur perfectly. In any event, the concentrated portion of the ingot containing impurities may ultimately be cut off to serve as a starting material for producing silicon for use in solar cells.

Figure 5A:
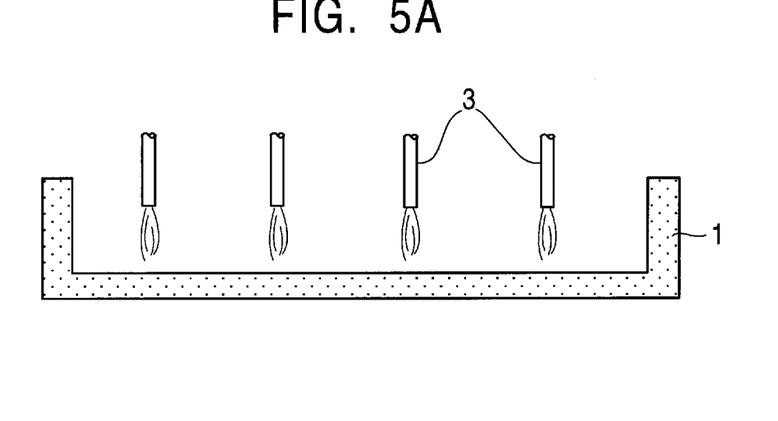
FIG. 5A shows pre-heating.
Figure 6:
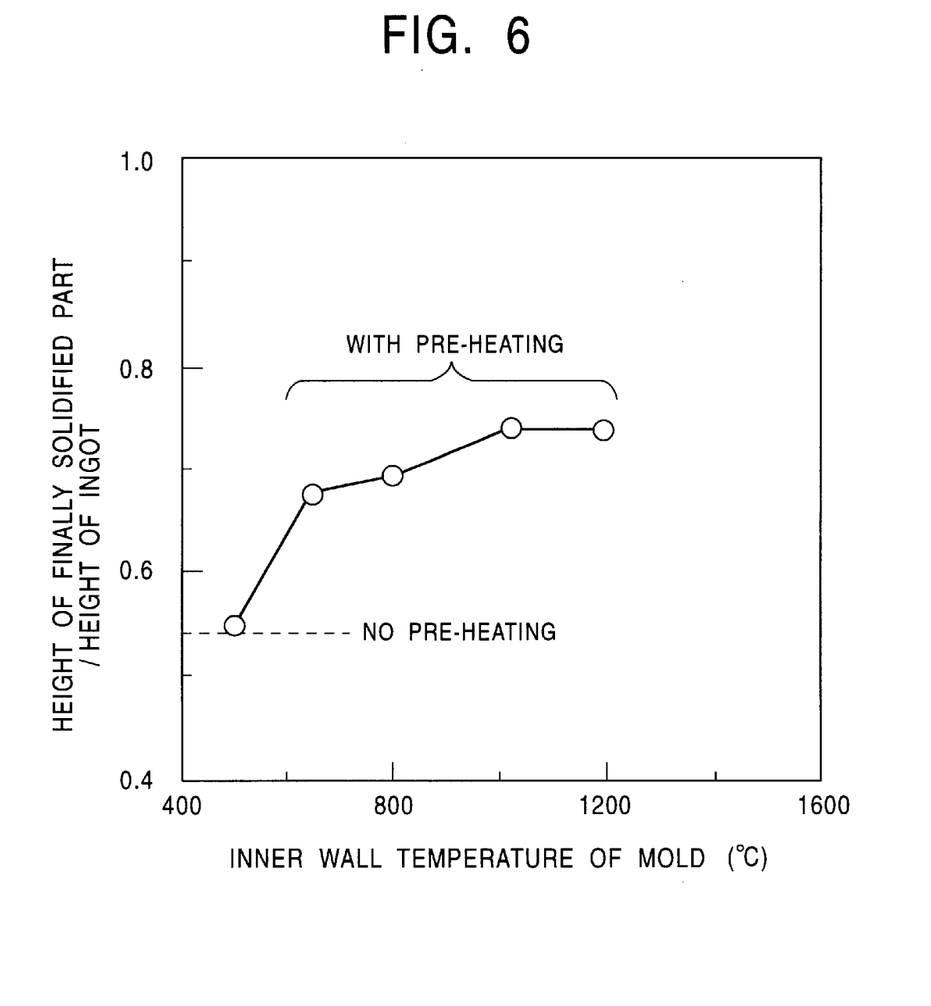
FIG. 6 is a graph indicating inner mold wall temperature versus height.

The interior wall of the mold 1 may be pre-heated prior to pouring of the liquid, as shown in FIG. 5A. The effect of this pre-heating is shown in FIG. 6. Pre-heating allows the solidification height of silicon to be increased, thereby improving its purified silicon yield. Heat leakage upwardly in the mold is required to be less than the downward heat leakage in this case, so that the liquid is heated from above the mold.

Figure 5B:
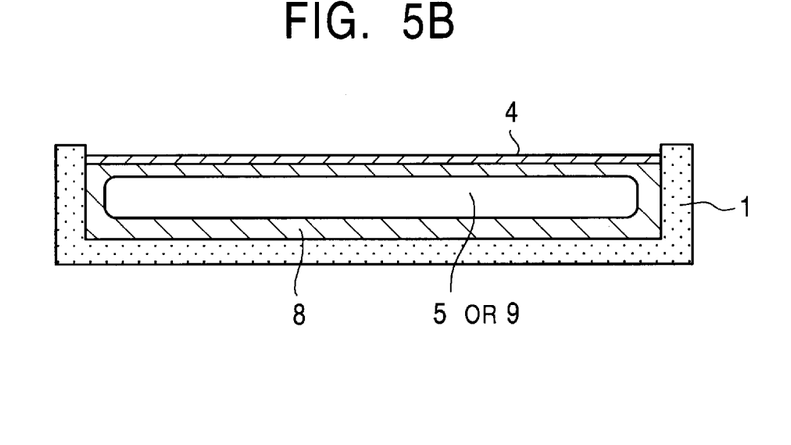
FIG. 5B shows solidification.
Figure 5C:
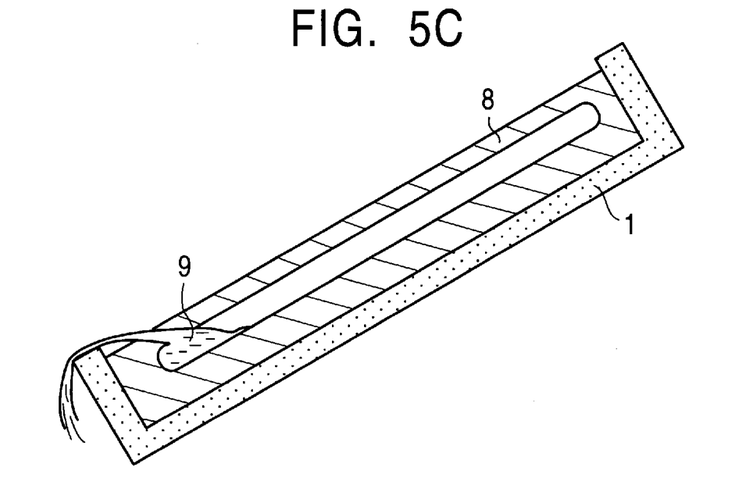
FIG. 5C shows discharge of residual liquid.

It is not always necessary to use the ingot cutting and removing method described above. The liquid need not be completely solidified. Instead, shortening of solidification time may be achieved by discharging the upper part of the liquid silicon 9 (FIGS. 5B and 5C), in which the impurities are concentrated during solidification, and by recycling the discharged portion 9 of the liquid to the electric furnace. The solidification step is stopped based on the height of the body of liquid in which the impurities are concentrated. In other words, volume or thickness of the inner residual liquid 9 is measured using an ultrasonic range finder (not shown) from above the solidification core 8, to determine its volume. The timing for terminating solidification is judged by comparing the measured value with a prescribed value. This prescribed value can be determined from the relationship between the percentage of impurity concentration and the thickness of the residual liquid 9 in previous runs of the process. Other methods may be used for measuring the depth of the liquid.

The operable ratio of height to corresponding diameter of the mold 1 is about 0.2 in a conventional cylindrical mold. When that ratio is less than about 0.2, impurities cannot be concentrated well. The preferred shape of mold 1 is a cylinder, or a square pipe or reversed cone, for example. The bottom of mold 1 may be cooled if desired, using a cooling jacket 2 (FIG. 1).

Fe and Al contents are controlled below about 1000 ppm because metallurgical grade silicon containing a higher impurity concentration cannot be purified so as to contain less than the prescribed impurities required for forming silicon for use in solar cells by a single solidification step.

The preferable temperature range for pre-heating of the mold is about 700° C. to about 1100° C. When that temperature is lower than about 700° C., the effect of pre-heating is small. When that temperature is higher than about 1100° C., the effect reaches a plateau and heat begins to be wasted.

The metallurgical grade silicon 8, from which the concentrated impurity portion 9 at the upper part of the pre-refined ingot 8 is removed, is crushed and purified as will hereinafter be described in detail. It forms silicon that is suitable for use in solar cells or for use as a substrate. The pre-purified, granular metallurgical grade silicon is melted at a reduced pressure of about $10^{-4}$ Torr or less to eliminate P. B and C are removed by oxidation in an oxidative atmosphere under atmospheric pressure or slightly subatmospheric pressure, followed by de-oxidation in an inert gas (such as Ar) under subatmospheric or atmospheric pressure. For example, heat plasma comprising an inert gas (such as Ar, $N_2$) blended with about 10% $H_2O$ or $CO_2$ is blown onto the molten silicon to eliminate B and C, followed by de-oxidation at about 1400 to about 1500° C. Subsequently, the metallurgical grade silicon is subjected to finishing dimensional solidification which decreases the metallic impurities to a prescribed level, thereby obtaining silicon for use in solar cells. The order of the vacuum-refining and oxidation-deoxidation steps may be reversed.

Figure 4B:
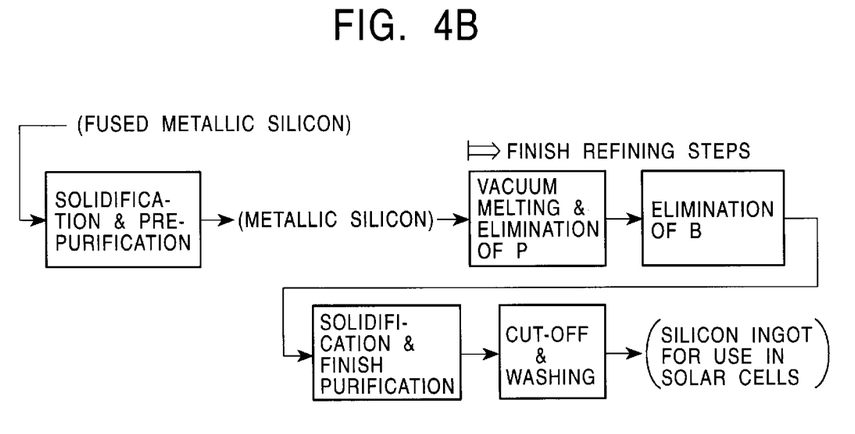
FIG. 4B is an embodiment of a method according to the invention.

When the pre-purified metallurgical grade silicon is purified, only one step of solidification purification is required, as is shown for example in FIG. 4B of the drawings. This prevents energy waste and material loss. Moreover, one of the steps in which the impurity concentrated portion of the ingot is cut off can be omitted. This improves the yield of silicon and simplifies the production process.

EXAMPLES

Example 1 and Comparative Example

Silicon oxide was reduced with carbon, followed by directly pouring it as a liquid into a mold. The performance of the invention was evaluated by comparison to the process shown in FIG. 4A, in which commercially available silicon which was not subjected to a pre-purification was used as the starting material.

The chemical composition of metallurgical grade silicon before and after pre-purification is shown in Table 1. The yield of silicon and the unit cost of electricity are listed in Table 2.

Silicon for use in solar cells was produced according to the process illustrated in FIG. 4B, using metallurgical grade silicon as the starting material. The percentage of silicon that was cut off in the pre-purification step was 3 to 15%.

TABLE 1

| | (ppm) | | | | | |
|---|---|---|---|---|---|---|
| | Fe | Al | Ca | Ti | P | B |
| before pre-purification | 1200 to 2100 | 500 to 1300 | 210 to 520 | 400 to 310 | 20 to 33 | 5 to 12 |
| after pre-purification (without pre-heating) | 350 to 990 | 200 to 590 | 40 to 120 | 29 to 160 | 21 to 32 | 4 to 13 |
| after pre-purification (with pre-heating) | 520 to 780 | 220 to 620 | 50 to 110 | 35 to 120 | 22 to 35 | 6 to 10 |

TABLE 2

| | Yield of silicon (%) | Unit price of electricity (kwh/kg product) |
|---|---|---|
| Example | | |
| no pre-heating | 65 to 74 | 45 to 58 |
| pre-heating at 1000° C. | 71 to 82 | 51 to 67 |
| Comparative example | 45 to 53 | 70 to 85 |

As shown in Table 2, the method for producing silicon for use in solar cells is superior to the duplicated solidification purification method. The chemical composition of silicon for use in solar cells obtained by the duplicated solidification purification method in the Example and Comparative Example were less than 0.1 ppm of P, 0.1 to 0.3 ppm of B, less than 0.1 ppm of Fe, less than 0.1 ppm of Al, less than 0.1 ppm of Ti, less than 0.1 ppm of Ca, less than 5 ppm of O, and less than 5 ppm of C.

In the case of directional solidification purification, the purification efficiency (yield) is determined by the initial impurity concentration and the solidification speed. Since there are some limitations which stem from the initial impurity concentration, considering the relation between the shape of the ingot and production speed, metallurgical grade silicon in which the impurity concentration has been decreased to a level below its upper limit should be used. However, the present invention alleviates such restrictions. According to the present invention, ingots with a desired purity can be produced by eliminating B, C and O after removing P. Alternatively, P may be eliminated after removing B and C followed by zone melting to eliminate other metallic impurities. This may be done irrespective of the impurity concentration of the starting silicon material.

Example 2

Figure 7A:
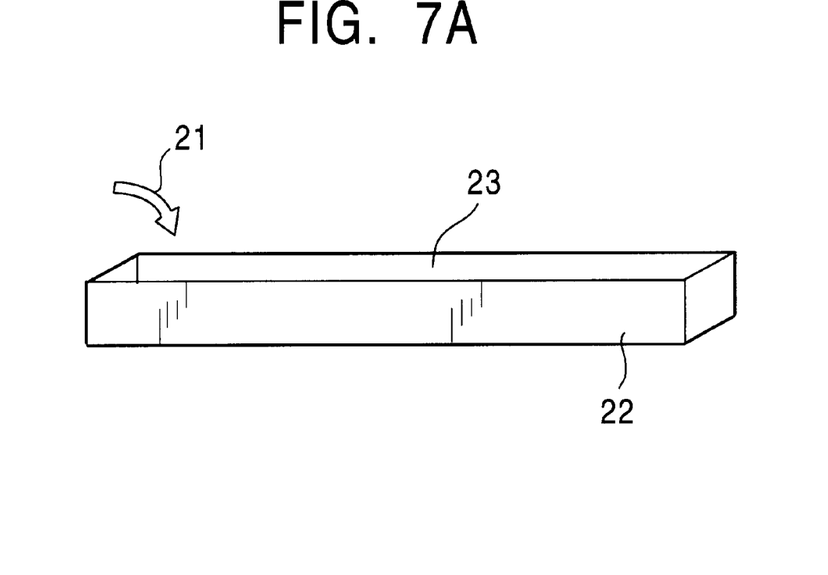
FIG. 7A is a perspective view of a mold.
Figure 7B:
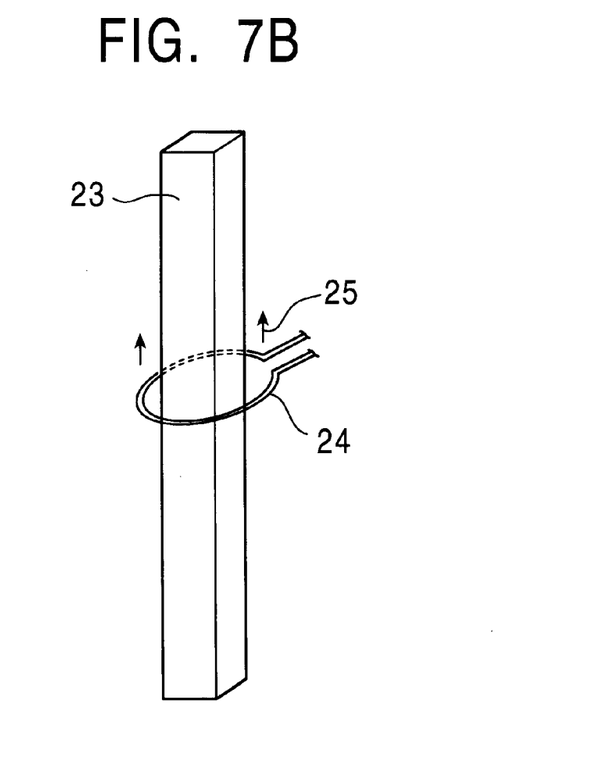
FIG. 7B is a perspective view of a rod and a heating coil.

As shown in FIG. 7A, a solidified silicon rod 23 was cast by cooling the molten silicon 21 in a long, slender mold 22. This was done without using a special mold or applying a heating and cooling procedure to the molten silicon after it was treated to remove P and B. Then, as shown in FIG. 7B, three turns of high frequency heating coils 24 were disposed around the solidified silicon rod 23. The high frequency heating coils 24 were caused to move in the travel direction 25 (FIG. 7B) longitudinally along the silicon rod, thereby successively repeating partial melting, cooling and solidification of successive portions of the silicon. The impurities were transferred to the liquid phase portion of the silicon, depending on their respective partition coefficients, when the liquid silicon was cooled and solidified. This decreased the impurity concentration in the solid phase. By successively repeating partial melting and solidification of the silicon rod, the impurity content in the rod was gradually decreased, thereby purifying the silicon.

Figure 8:
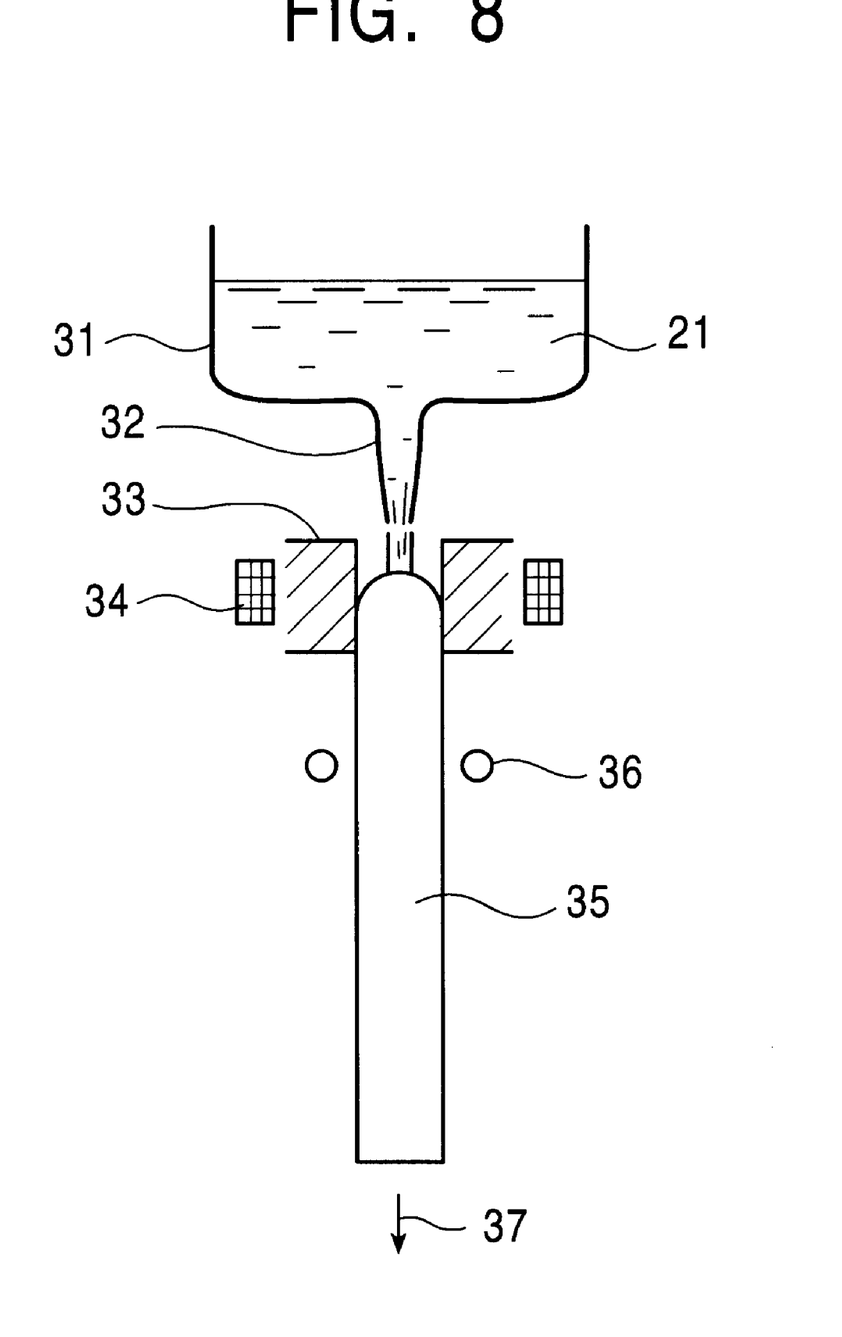
FIG. 8 is an illustration of continuous molding according to this invention.

In another embodiment of the present invention as shown, for example, in FIG. 8, the silicon rod was continuously cast and pulled out. In this embodiment, molten silicon 21 from which P and B were eliminated in turn-dish 31 was continuously poured into a continuous casting mold 33 via a nozzle 32. The molten silicon was stirred and caused to solidify without contacting the wall 33 by action of an electromagnetic coil 34. The silicon rod (ingot 35) produced by continuous casting traveled along the draw direction 37 while passing through a group of high frequency coils 36. Therefore, the silicon rod was purified by simultaneously applying a continuous casting method and zone melting. This continuous operation was performed by adjusting the continuous casting speed to 1 to 3 mm/min.

After eliminating P, B, C and O, silicon was continuously cast by the apparatus illustrated in FIG. 8, followed by zone-melting of the rod-like ingot 35. The test results were as follows:

Production scale: 40 kg

Dimension of mold: 150 mm×150 mm

Casting speed: 2 mm/min

High frequency coil: 5 kHz×3 steps

Electricity: 800 kWh

Impurities in silicon after elimination of P and B: Fe: 1010 ppm, Al: 1055 ppm

Impurities in silicon after final purification: Fe: <0.1 ppm, Al: <0.1 ppm

Figure 10:
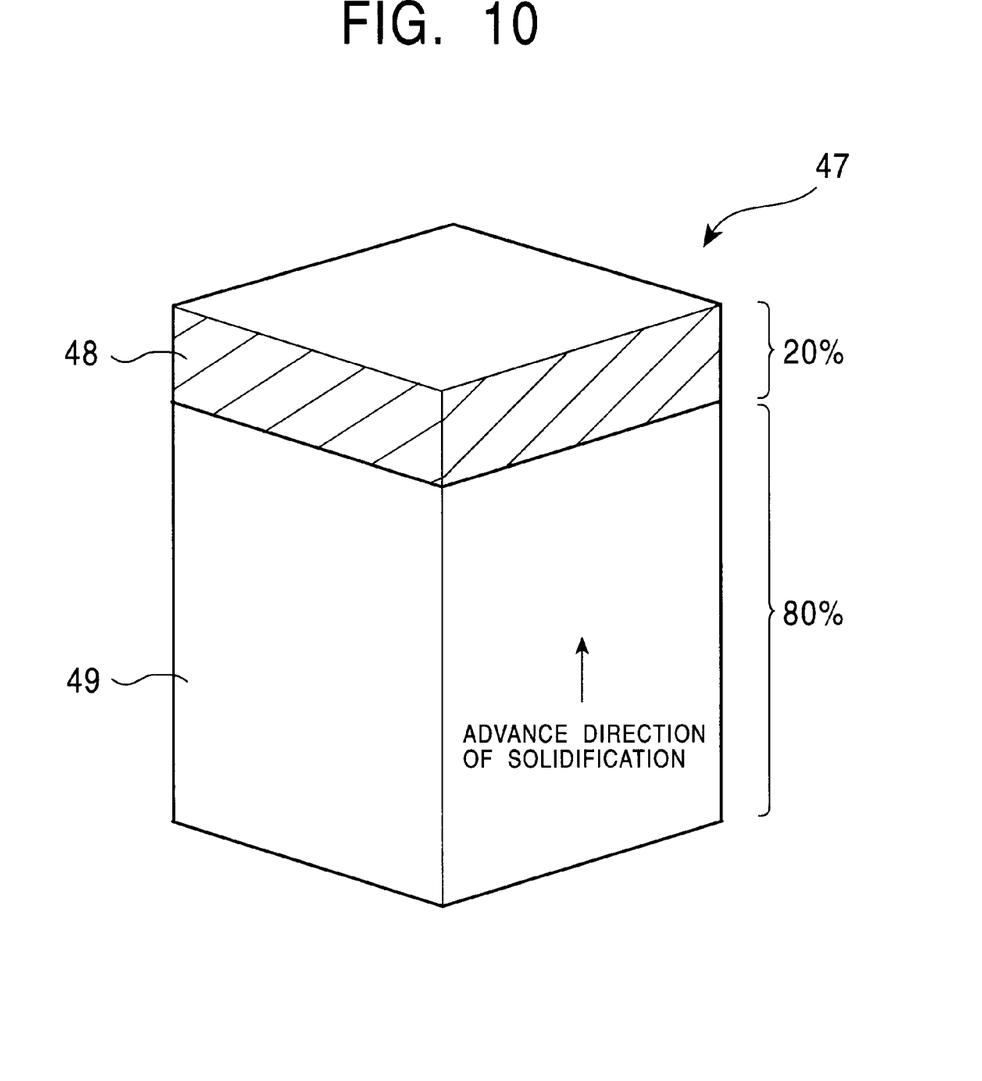
FIG. 10 is a perspective view illustrating an ingot obtained in a solidification purification process according to this invention.

FIG. 10 is an illustrative drawing of an ingot 47 obtained from solidification purification. Impurities are concentrated at a portion which is about 20% from the top of the ingot 47 (oblique line portion in the figure). The portion 48 is discarded due to inability to use it in a post-process or as a final product.

In accordance with the present invention, the portion 48 which is usually discarded can now be recycled as a material suitable for vacuum refining, oxidative refining or solidification pre-purification. Although the portion 48 might be crushed and recycled, this would return the previously removed impurities to the same production process. Accordingly, the impurities are removed prior to recycling.

The portion 48 was crushed, preferably to a maximum grain diameter of about 5 mm. The crushing method is not critical, but care should be taken not to allow the crushed silicon to become contaminated with other impurities. The maximum grain diameter in the range described above is preferable because silicon crystals in the cut-off portion 48 of the ingot 47 have a grain diameter of 0.5 to 2 mm. Therefore, the ingot was preferentially cracked along the grain boundaries by crushing. In other words, more grain boundaries are exposed by crushing. This facilitates the leaching speed, or the efficiency of removing impurity elements with an acid solution 42 (FIG. 9), as will be apparent.

Figure 9:
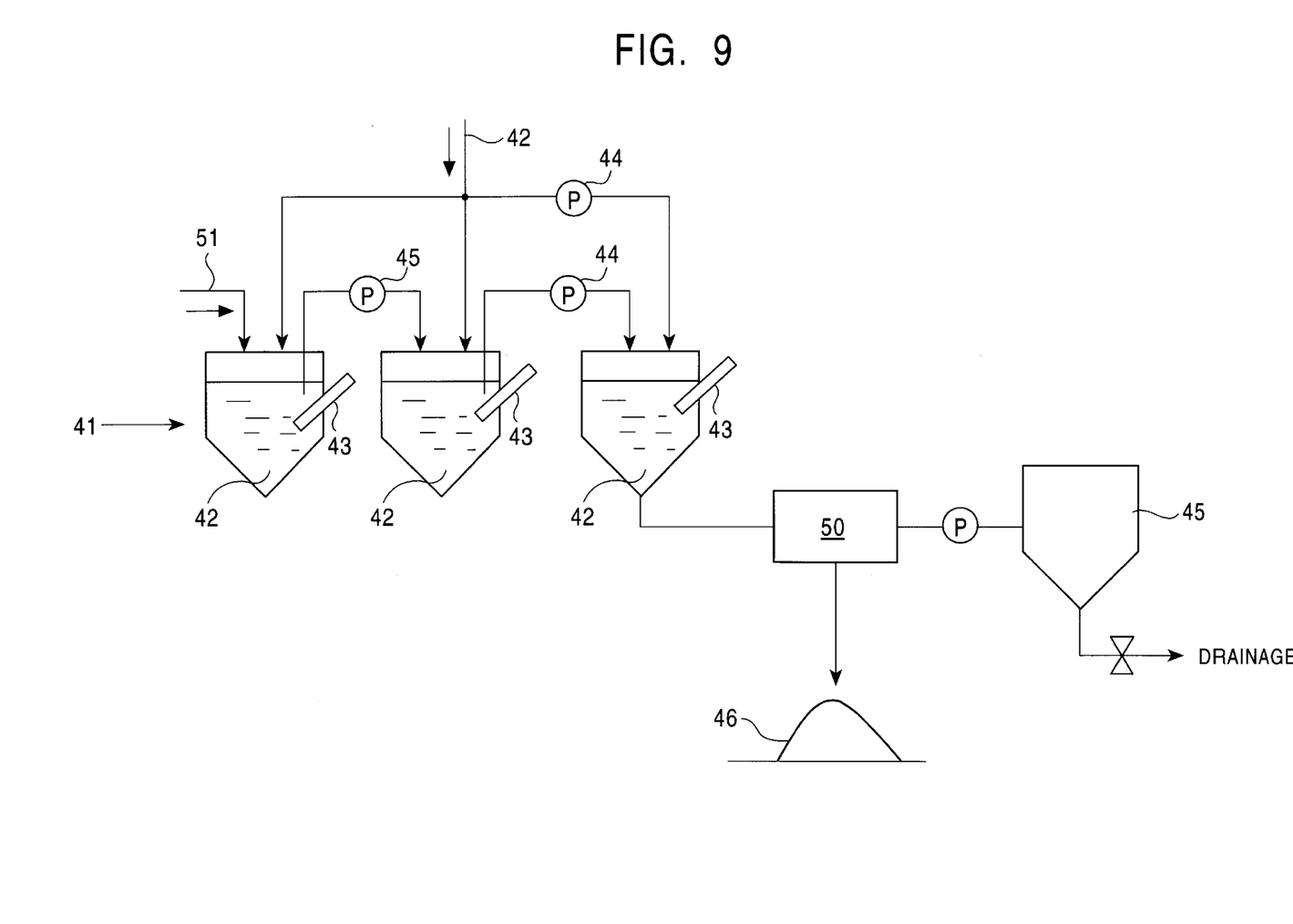
FIG. 9 is an illustration of a soaking bath with an acid solution used for recycling metallurgical grade silicon in accordance with this invention.

The crushed pieces were supplied to a leaching vessel 41 (FIG. 9) and were contacted with acid solution 42 independently supplied. While a continuous processing method using a plurality of leaching vessels is shown in FIG. 9, a single leaching vessel may be used.

The acid solution 42 was an aqueous solution composed mainly of hydrofluoric acid (used for washing semiconductors) to which nitric acid, sulfuric acid or hydrochloric acid was appropriately mixed. The amount of the acid solution 42 was selected depending on the impurity concentration in the silicon to be leached, or the leaching scale. Appropriate leaching temperature, stirring method and degree of stirring also were selected considering leaching efficiency.

The residue after leaching the elemental impurities in the acid solution 42 was finally washed and dried, and recycled to the vacuum refining process to recover silicon as a starting material.

Example 3

The concentrated impurity portion 48 was crushed into grains having a maximum grain diameter of 2 mm and the grains were supplied to the leaching vessel 41 (FIG. 9). The concentrations of Fe and Al in the metallurgical grade silicon subjected to the solidification pre-purification process were 1050 ppm and 780 ppm, respectively. Feed scale of the crushed silicon was 5 kg/hr. The acid solution 42 used for leaching was an aqueous solution of HF+HNO$_3$ or HF+HNO$_3$+HCl with content of 10% by volume. The flow rate was 10 liters per 1 kg of the crushed silicon. The leaching work was carried out by blowing argon into the acid solution 42 at 55° C. for 3 hours with stirring.

The results of leaching were evaluated by the decrease in elemental impurities. They are shown in Table 3. The data in Table 3 demonstrate that the relatively impure silicon produced in the solidification purification step can be recycled according to the invention to make good silicon for use in solar cells. The Fe and Al concentrations in the relatively impure silicon were reduced to levels that corresponded to, or were less than, concentrations found in metallurgical grade silicon usually supplied to the solidification purification process.

TABLE 3

| Extraction solution | (ppm) | | | |
|---|---|---|---|---|
| | HF + HNO₃ | | HF + HNO₃ + HCl | |
| | before leaching | leaching residue | before leaching | leaching residue |
| Impurity elements | | | | |
| Fe | 7800 | 860 | 9300 | 1030 |
| Al | 1820 | 240 | 1570 | 290 |

Example 4

The concentrated impurity portion 48 in the ingot obtained in the solidification purification step was crushed. The crushed pieces were fractionated using a sieve with a mesh of 1 mm, 2.8 mm, 5.2 mm, and 9.7 mm. Each fraction was extracted with an acid solution in the continuous acid leaching vessel 41 as in Example 3. The feed speed of the crushed grains was 10 kg/hr. A 20% aqueous solution of HF+HNO₃ was used for leaching. Leaching was carried out for 4 hours at 75° C. by blowing nitrogen gas into the acid solution 2 with stirring.

Figure 11:
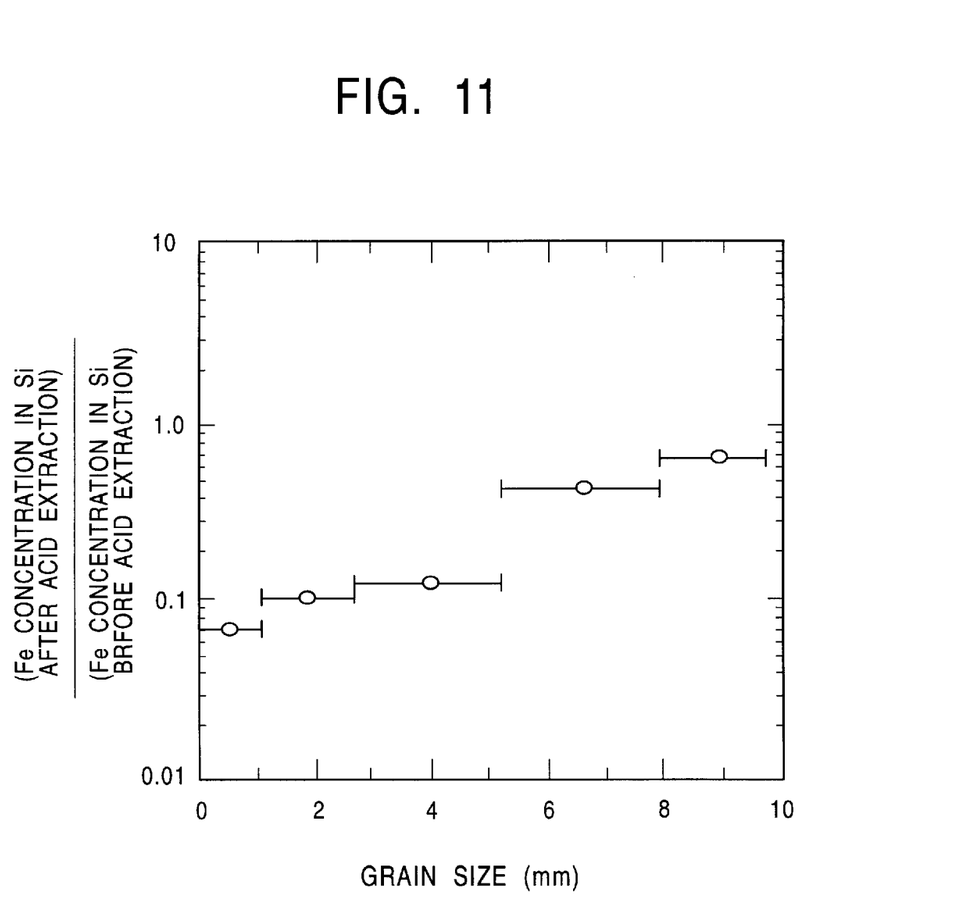
FIG. 11 is a graph showing the relationship between grain size of crushed pieces of silicon and the concentration of Fe before and after leaching.

Impurity elimination by acid leaching with respect to the relationship between Fe concentration before leaching with an acid solution and crushed grain diameter is shown in FIG. 11. The data shown in FIG. 11 demonstrate that the smaller the grain diameters, the better Fe was eliminated from the crushed grains. Notably, when crushed grains fractionated with a 5.2 mm sieve were leached with an acid solution, the impurities were reduced to about ¹⁄₁₀ of the impurity level before leaching. It was found that crushed grains with a maximum grain diameter of 1 mm tend to clog the circulation pump. Moreover, there is a possibility that these grains may be discarded inadvertently with the acid solution since the grains are finely dispersed in the acid solution. Thus, only a small quantity of these crushed grains of silicon can be recovered.

Example 5

The concentrated impurity portion 48 was crushed into grains having a maximum diameter of 3 mm, and the grains were supplied to the continuous leaching vessel with a feed speed of 8 kg/hr. The grains were subjected to leaching with an acid solution. The acid solution was prepared by adjusting the acid solutions shown in Tables 4 and 5 to an acid concentration of 25:5 by volume. The composition of the leaching solution was varied over a wide range to find an appropriate composition. The quantity of each acid solution used was 13 liters per 1 kg of the crushed grains. The leaching work was carried out by blowing in argon gas for 7 hours with stirring. The temperature of the acid solution was 80° C. in all cases.

The results of leaching were evaluated by reference to the concentration changes of Fe and Al, and are as shown in Tables 4 and 5. With respect to Fe and Al elimination, Tables 4 and 5 demonstrate that use of acid solutions containing hydrofluoric acid and nitric acid are preferred.

TABLE 4

| Leaching Solution | | (ppm) | | | | | | | |
|---|---|---|---|---|---|---|---|---|---|
| | | HCl | | HNO₃ | | H₂SO₄ | | HF | |
| | | Before leaching | Leaching residue | Before leaching | Leaching residue | Before leaching | Leaching residue | Before leaching | Leaching residue |
| Impurity element | Fe | 5743 | 5680 | 6220 | 6020 | 5930 | 5510 | 8260 | 8030 |
| | Al | 704 | 620 | 780 | 743 | 647 | 613 | 903 | 882 |

TABLE 5

| Leaching Solution | | (ppm) | | | | | | | |
|---|---|---|---|---|---|---|---|---|---|
| | | HCl + HNO₃ | | HCl + H₂SO₄ | | HCl + HF | | HF + H₂SO₄ | |
| | | Before leaching | Leaching residue | Before leaching | Leaching residue | Before leaching | Leaching residue | Before leaching | Leaching residue |
| Impurity element | Fe | 6340 | 6180 | 5720 | 5510 | 6770 | 6680 | 9360 | 7460 |
| | Al | 759 | 722 | 693 | 701 | 879 | 856 | 684 | 547 |

The method of the present invention produces silicon for use in solar cells in a simplified process while improving the yield of silicon recovery, thereby reducing the cost of production of silicon for use in solar cells.

What is claimed is:

1. A process for producing purified silicon for use in solar cells from silicon oxide, comprising the steps:
   (a) reducing molten silicon oxide with carbon, thereby forming fused metallurgical grade silicon;
   (b) pouring and directionally solidifying said fused metallurgical grade silicon in a mold to produce a solidified silicon having Fe and Al contents below about 1000 ppm;
   (c) vacuum melting in a container the resulting solidified silicon for removal of P therefrom;
   (d) refining the resulting molten silicon for removal of B and C therefrom, and
   (e) solidifying and purifying the resulting refined molten silicon wherein said solidifying is a single solidification step.

2. The method according to claim 1, wherein in step (b) said fused metallurgical grade silicon is introduced into the mold, forming a liquid having a liquid surface, said mold having a height-area ratio defined substantially by the equation:

$$H/(S/\pi)^{1/2} \geq 0.4$$

wherein H is the height of the liquid surface and S is the mean cross-sectional area of the mold, and wherein said introduced fused metallurgical grade silicon is gradually cooled and partially solidified while heating said liquid surface or heat-insulating said liquid surface to retard solidification, and discharging a portion of said silicon that remains liquid, thereby forming said solidified silicon having Fe and Al contents below about 1000 ppm.

3. The method for producing silicon according to claim 2, wherein said mold is preheated at about 700 to 1100° C. prior to introduction of said fused metallurgical grade silicon into said mold.

4. The method according to claim 2, wherein said liquid silicon in said mold has a thickness, and wherein the thickness of said liquid silicon in said mold is measured during solidification, and wherein said liquid silicon is discharged from said mold when said measured value reaches a limiting value to obtain said solidified silicon having Fe and Al contents below 1000 ppm.

5. The method according to claim 3, wherein said liquid silicon in said mold has a thickness, and wherein the thickness of said liquid silicon in said mold is measured during solidification and wherein said liquid silicon is discharged from said mold when said measured value reaches a limiting value to obtain said solidified silicon having Fe and Al contents below 1000 ppm.

6. The method according to claim 4, wherein the thickness of said liquid silicon is measured with an ultrasonic range finder.

7. The method according to claim 5, wherein the thickness of said liquid silicon is measured with an ultrasonic range finder.

8. A method according to claim 1, further comprising the step of:

eliminating O by de-oxidation after step (d);
and wherein
in said refining step (d), removing B and C from said molten silicon while in said container by introducing into said container an acidic gas and an inert gas, thereby forming a mixed gas, and by contacting said mixed gas with said molten silicon while maintaining said silicon in the liquid state;
in step (e), said solidifying comprises casting said refined molten silicon into a solidified rod; and said purifying comprises zone melting said solidified rod to remove Fe, Al, Ti and Ca.

9. The method according to claim 8, wherein the step of casting said refined molten silicon into the form of a solidified rod comprises continuous casting in an electro-magnetic mold.

10. The method according to claim 1, wherein said solidified and purified silicon of step (e) contains a relatively contaminated portion having a higher concentration of impurities and a more pure portion having a lower concentration of impurities, the process further comprises the steps of:

(f) cutting off said contaminated portion from said more pure portion thereby forming a cut-off portion;

(g) crushing said cut-off portion, thereby forming crushed silicon;

(h) removing said impurities from said crushed silicon by leaching said impurities with an acidic solution; and (i) recycling the leached crushed silicon by re-introducing it as solidified silicon into step (c) of the process.

11. The method according to claim 10, wherein said cut-off portion is crushed into grains having a maximum diameter of about 5 mm.

12. The method for producing silicon for use in solar cells according to claim 10, wherein said acid solution is a mixed solution of hydrofluoric acid and nitric acid.

13. The method according to claim 2, wherein said solidified and purified silicon of step (e) of claim 1 contains a relatively contaminated portion having a higher concentration of impurities and a more pure portion having a lower concentration of impurities, the process further comprises the steps of:

(f) cutting off said contaminated portion from said pure portion, thereby forming a cut-off portion;

(g) crushing said cut-off portion, thereby forming crushed silicon;

(h) removing said impurities from said crushed cut-off portion by leaching said impurities with an acidic solution; and (i) recycling said leached crushed silicon by re-introducing it as solidified silicon into step (c) of the process.

14. The method according to claim 13, wherein said cut-off portion is crushed into grains having a maximum diameter of about 5 mm.

15. The method according to claim 13, wherein said acid solution is a mixed solution of hydrofluoric acid and nitric acid.

16. The method according to claim 8, wherein said solidified and purified silicon of step (e) contains a more contaminated portion having a higher concentration of impurities and a more pure portion having a lower concentration of impurities, the process further comprises the steps of:

(k) cutting off said more contaminated portion from said more pure portion, thereby forming a cut-off portion;

(l) crushing said cut-off portion, thereby forming crushed silicon;

(m) removing impurities from said crushed silicon by leaching said impurities in said crushed silicon with an acidic solution; and (n) recycling said leached crushed silicon by reintroducing it as solidified silicon into step (c) of the process.

17. The method according to claim 16, wherein said cut-off portion is crushed into grains having a maximum diameter of about 5 mm.

18. The method according to claim 16, wherein said acid solution is a mixed solution of hydrofluoric acid and nitric acid.

* * * * *

UNITED STATES PATENT AND TRADEMARK OFFICE
CERTIFICATE OF CORRECTION

PATENT NO.: 6,090,361
DATED: July 18, 2000
INVENTOR(S): Hiroyuki Baba et al.

It is certified that error appears in the above-identified patent and that said Letters Patent is hereby corrected as shown below:

On the title page, after "[30] Foreign Application Priority Data", line 2, please change "March 24, 1997" to -- March 27, 1997--.

In column 10, table 4, under heading "HCl", under sub-heading "Before leaching", line 1, please change "5743" to --5740--.

Signed and Sealed this

Tenth Day of April, 2001

Attest:

NICHOLAS P. GODICI

*Attesting Officer*  *Acting Director of the United States Patent and Trademark Office*